United States Patent [19]
Inaba et al.

[11] Patent Number: 5,621,605
[45] Date of Patent: Apr. 15, 1997

[54] NEUTRALIZING APPARATUS FOR CHARGED BODY

[75] Inventors: Hitoshi Inaba, Atsugi; Tadahiro Ohmi, 1-17-30, Komegakubo 2-chome, Aoba-ku, Sendai-shi, Miyagi-ken 980, both of Japan

[73] Assignees: Tadahiro Ohmi, Miyagi-ken; Takasago Netsugaku Kogyo Kabushiki kaisha, Tokyo, both of Japan

[21] Appl. No.: 978,678

[22] PCT Filed: Aug. 20, 1991

[86] PCT No.: PCT/JP91/01104

§ 371 Date: Feb. 24, 1993

§ 102(e) Date: Feb. 24, 1993

[87] PCT Pub. No.: WO92/04819

PCT Pub. Date: Mar. 19, 1992

[30] Foreign Application Priority Data

Aug. 31, 1990 [JP] Japan ................................ 2-230184
Mar. 13, 1991 [JP] Japan ................................ 3-073908

[51] Int. Cl.⁶ .................................................. H05F 3/06
[52] U.S. Cl. ........................ 361/213; 361/230; 361/231
[58] Field of Search ................................ 361/230, 231, 361/212–215, 220–222, 216; 324/158 R; 307/91

[56] References Cited

U.S. PATENT DOCUMENTS

| | | | |
|---|---|---|---|
| 4,542,434 | 9/1985 | Gehlke et al. | 361/231 |
| 4,642,728 | 2/1987 | Unger | 361/213 |
| 4,646,009 | 2/1987 | Mallory | 324/158 R |
| 4,757,421 | 7/1988 | Mykkanen | 361/231 |
| 4,827,371 | 5/1989 | Yost | 361/213 |
| 5,254,229 | 10/1993 | Ohmi et al. | 361/213 |
| 5,351,415 | 10/1994 | Brooks et al. | 361/213 |

FOREIGN PATENT DOCUMENTS

| | | |
|---|---|---|
| 42-1353 | 1/1942 | Japan . |
| 45-8892 | 4/1970 | Japan . |
| 59-12600 | 1/1984 | Japan . |

*Primary Examiner*—William M. Shoop, Jr.
*Assistant Examiner*—Peter Ganjoo
*Attorney, Agent, or Firm*—Baker & Daniels

[57] ABSTRACT

A neutralizing apparatus is provided to facilitate and efficiently implement electric charge removal from a charged body such as a wafer which is easily charged. When the easily charged body such as a wafer is transported in a housing, a neutralizing charge generator, typically light sources for projecting exciting ultraviolet rays into the housing, are operated. Accordingly, the housing is filled with ions and a gas such as non-reactive gas. The neutralizing charge generator can generate positive or negative ions and electrons. When the charged body is positively charged, the electrons or negative ions move toward the charged body to neutralize the charged body with positive charge. When the charged body is negatively charged, positive ions move toward the charged body to neutralize the negative charge.

12 Claims, 17 Drawing Sheets

FIG_1

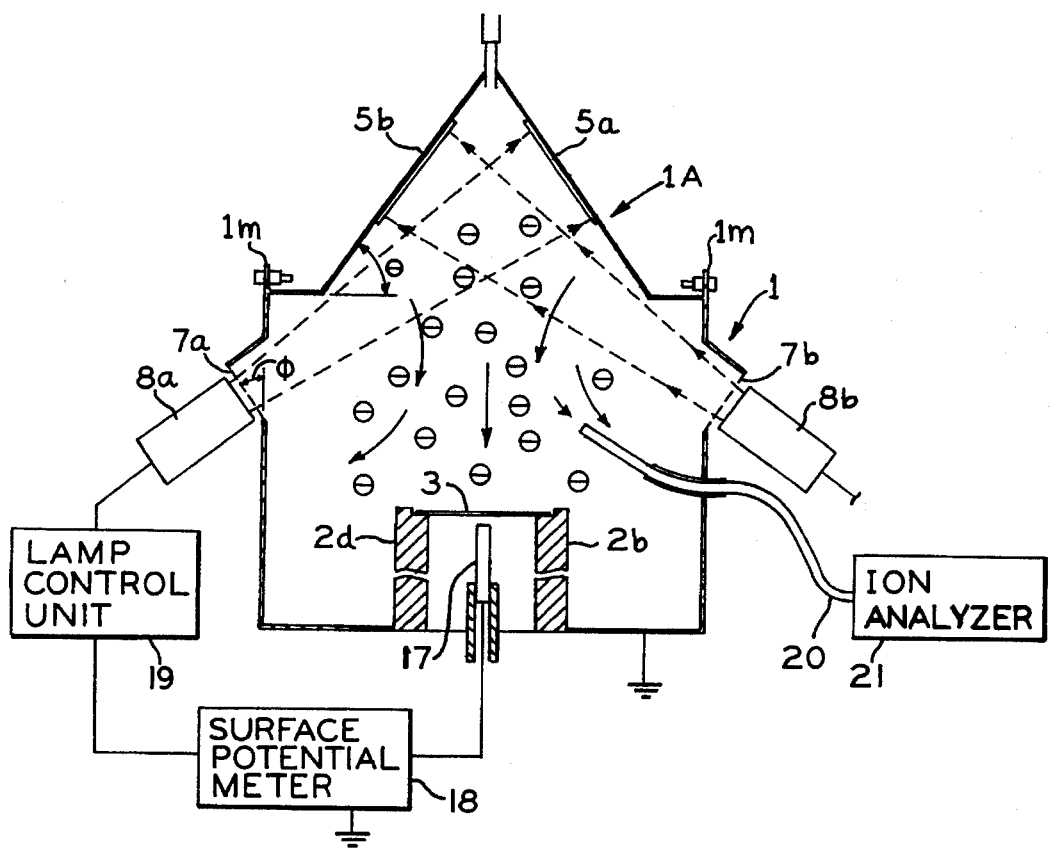
FIG_4

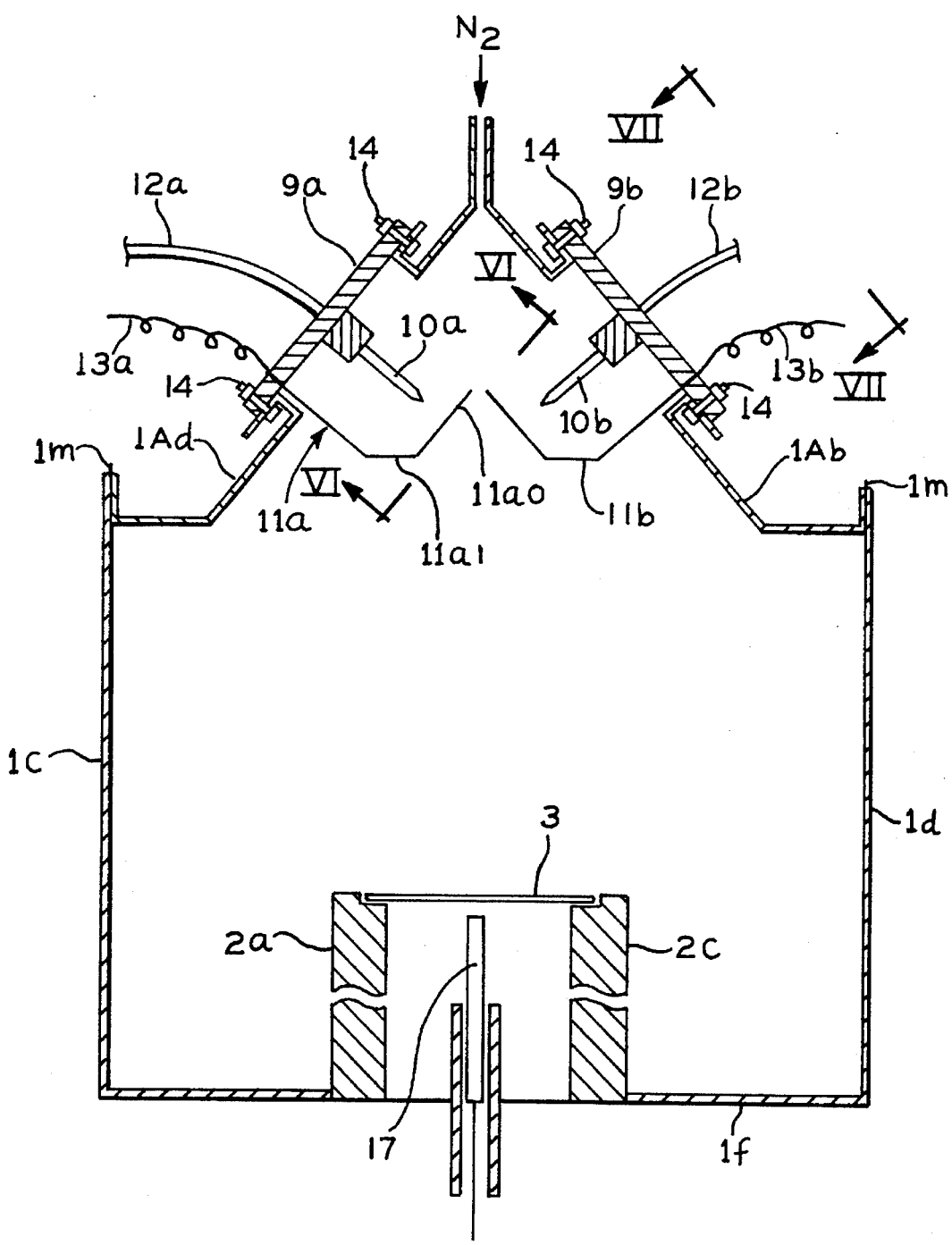
FIG_5

FIG_6
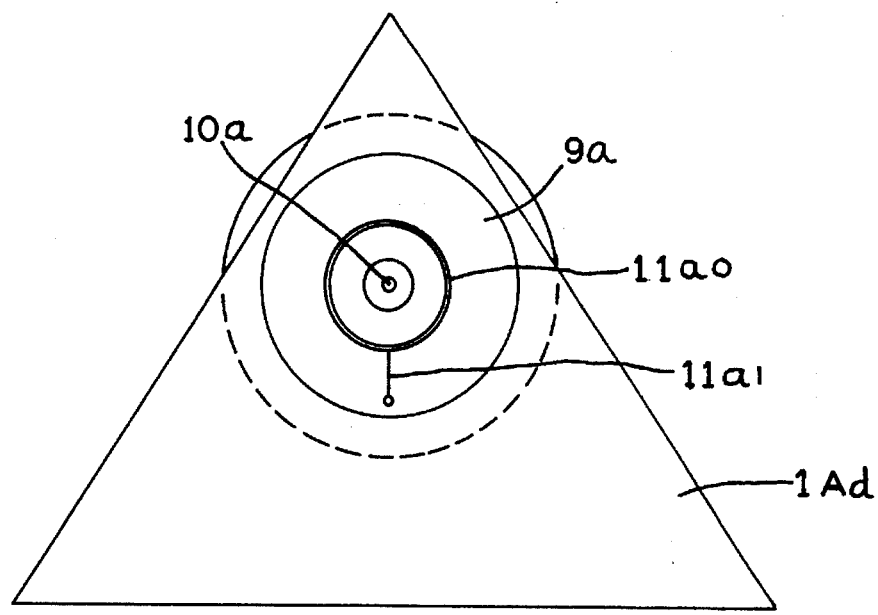
FIG_7
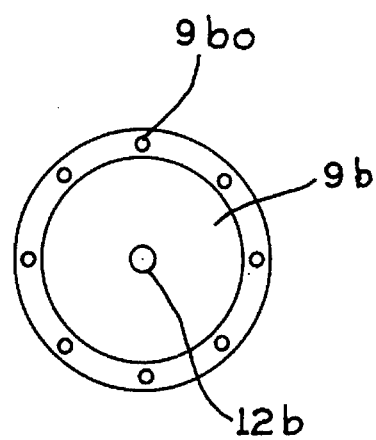

NEUTRALIZING APPARATUS FOR CHARGED BODY

FIELD OF THE INVENTION

The present invention relates to a neutralizing apparatus used to neutralize a charged body such as a substrate (a wafer) or carrier in manufacturing process of semiconductor devices because the substrate, the carrier or the like is so easily charged and should be kept away from charged condition.

TECHNOLOGICAL BACKGROUND

In conventional manufacture of semiconductor devices, it is well known to perform, for example, transportation of a wafer from one processing room to the other processing room through a dedicated path or directly so as to perform a predetermined sequential processing to the wafer. In this case, there are many opportunity to perform a variety of handling such as grasping, or transportation of the wafer. In particular, instruments and the like contacting the wafer during handling are generally made of fluorocarbon resin, quartz or the like so as to avoid the wafer from being contaminated by metal. Therefore, when the wafer contacts the instruments, the wafer tends to be positively charged and to be at a high potential because of the electrification rank relationship with respect to the instruments.

The wafer is charged positively or negatively according to electrification rank of the contacting material with respect to the wafer as follows: the wafer is charged within a range from +500 to +3300 [V] when grasping the wafer by a pincette made of fluorocarbon resin, and is charged within a range from +600 to +2000 [V] when mounting the wafer on a stand made of polypropylene. Further, the wafer is charged within a range from +1000 to +1500 [V] when mounting the wafer on a quartz plate by using the pincette made of fluorocarbon resin, and is charged within a range from +500 to +3300 [V] when washing the wafer by extrapure water. Moreover, the wafer is charged within a range −200 to −1000 [V] when spraying gaseous nitrogen on the wafer.

However, if the wafer or the carrier is charged, suspended particles may be adhered to the wafer or the carrier by electrostatic force, or the semiconductor devices, during manufacturing, may be destroyed due to electrostatic discharge.

FIG. 9 illustrates the amount of suspended particles adhered by the electrostatic force to the wafer per surface potential of the wafer. There is shown the result of experiment in which a 5 inch wafer is employed as the wafer, and the wafer is vertically mounted through an insulating stand on a conductive grating. In FIG. 9, the transverse axis shows a potential of the wafer, and the ordinate shows the number of adhering particles. Here, the number of adhering particles means the number of particles adhering to effective area of the wafer (which is 69.4 [cm$^2$] for a 5 inch wafer). It will be appreciated that the number of the adhering particles is converted to the number of particles adhering to the effective area, provided that the wafer is left for five hours in an atmosphere containing ten particles having a particle diameter of 0.5 [μm] or more per unit volume (cubic feet).

Referring to FIG. 9, there is little accumulation of particles due to gravity settling in case the wafer is vertically mounted. Accordingly, no particle adheres to the wafer when the wafer potential is low, i.e., at a range of 0 to 50 [V]. However, the number of the adhering particles is rapidly increased due to the effect of electrostatic force as the wafer potential rises in a range of 300 to 1800 [V].

FIG. 10 illustrates an adhering range of the suspended particles by the electrostatic force with a particle diameter used as a parameter provided that high voltage (1000 [V]) is applied to the wafer W. In this case, a particle concentration is set to 1 [g/cm$^3$]. Further, in FIG. 10, the rectangular closing line shows potential 0, the dotted lines in the closing line show equipotential lines, and the solid lines show lines of electric force.

Referring to FIG. 10, there are little particles adhering to the wafer when particles have a particle diameter of 2 [μm]. As the particle diameter is decreased to 0.5 [μm] or 0.1 [μm], the adhering range is rapidly extended. That is, it will be appreciated that the smaller the particle diameter of the suspended particles, the easier the particles are adhered to the wafer due to the electrostatic force.

There are two well-known methods to avoid the wafer or wafer carrier from being charged as follows: one is a method employing a so-called ionizer, that is, a method for generating corona discharge in an atmosphere where the wafer or the wafer carrier is placed and neutralizing the resultant ions with the charge. The other is a method for handling the wafer by using a grounded metallic body or a resin material containing grounded conductive materials (carbon, metal and the like) so as to discharge the charge.

However, the corona discharge in the atmosphere is conventionally utilized in the first method. Consequently, positive ions in generated ions are mainly ions of water $(H_2O)nH+$ so that the water ions $(H_2O)nH+$ develop a growth of natural oxide film on the wafer surface. Further, negative ions in the generated ions are mainly $CO_3-$, $NO_x-$ and $SO_x-$ so that these negative ions also cause formation of a natural oxide film because of the strong oxidizing force thereof as in the case of the positive ions.

On the other hand, the wafer conventionally directly contacts the metal or the conductive materials in the second method. Hence, particles of the metals or the conductive materials are adhered to the wafer, resulting in dark current or leakage current.

SUMMARY OF THE INVENTION

To overcome the problems in the prior art as set forth above, it is an object of the present invention to provide a neutralizing apparatus which can avoid the formation of the natural oxide film or the occurrence of a dark current or a leakage current due to the contamination in a charged body such as a wafer which is easily charged.

In order to achieve the above-mentioned object, there is provided a neutralizing apparatus including a housing which can contain a charged body having a predetermined charge, gas introducing means for introducing non-reactive gas into the housing with respect to at least the charged body, and neutralizing charge generating means for selectively generating ions which can neutralize the predetermined charge in the housing.

There is also provided a neutralizing charge generating means including a light source for projecting ultraviolet rays into the housing so as to generate ions and electrons in the housing. The neutralizing charge generating means is an ion and electron generating means including a light source for projecting ultraviolet rays into the housing. A photocathode member is provided in the housing to receive the ultraviolet rays so as to generate an external photoelectric effect.

The neutralizing charge generating means is provided with a first neutralizing charge generating means including a light source for projecting the ultraviolet rays into the housing. The photocathode member is provided in the housing to receive the ultraviolet rays so as to generate the external photoelectric effect. A second neutralizing charge generating means including a discharging apparatus for generating corona discharge is also provided in the housing. Further, the first and the second neutralizing charge generating means can be selectively operated.

The non-reactive gas is high purity nitrogen or high purity argon.

For example, when transporting an easily charged body such as a wafer so as to perform a variety of processing (in, for example, transporting the wafer from a pretreatment room to an oxidation treatment room), the non-reactive gas (nitrogen, argon or the like) is introduced into the housing in which the charged body is disposed. If the charged body is positively charged, the ultraviolet rays are projected into the housing from the light source which forms the neutralizing charge generating means so as to excite an atmosphere in the housing. Consequently, the positive charge of the charged body is neutralized with electrons or negative ions in the excited atmosphere.

On the other hand, if the transported body is negatively charged, the negative charge of the charged body is neutralized with positive ions which is generated by the excitation in the housing.

BRIEF DESCRIPTION OF THE DRAWINGS

FIG. 4 is a vertical sectional view taken along line IV—IV of FIG. 3;

FIG. 5 is a vertical sectional view taken along line V—V of FIG. 3;

FIG. 6 is a front view taken along line VI—VI of FIG. 5;

FIG. 7 is a plan view taken along line VII—VII of FIG. 5;

DESCRIPTION OF THE PREFERRED EMBODIMENTS

Figure 1:
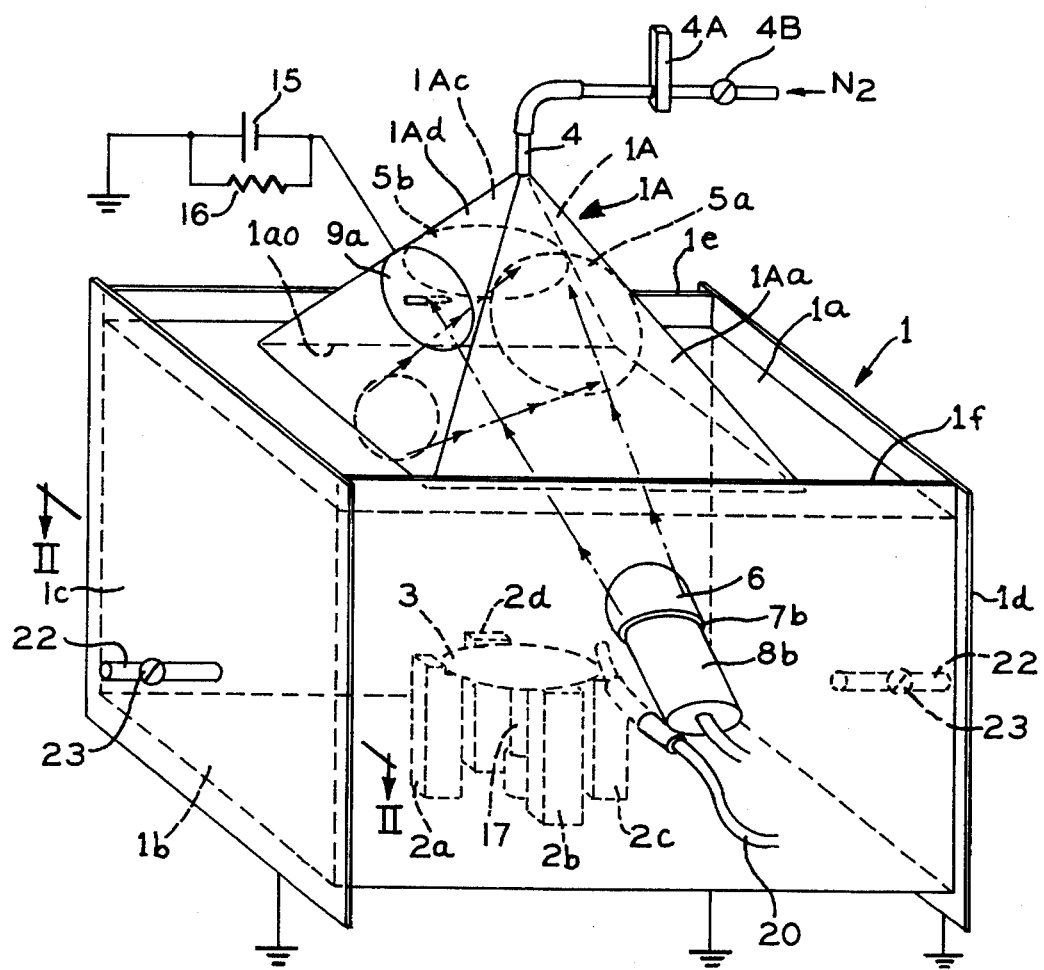
FIG. 1 is a perspective view showing one embodiment of the present invention.

Throughout the drawings, reference numerals respectively denote parts in embodiments of the present invention as follows: 1 is a housing, 3 and 33 are wafers (charged bodies), 30 is a tunnel housing, 5a and 5b are photocathode members (first neutralizing charge generating means), 8a and 8b are light sources (the first neutralizing charge generating means, and a third neutralizing charge generating means), 10a and 10b are needle-type electrodes (second neutralizing charge generating means), and 11a and 11b are opposing electrodes (second neutralizing charge generating means).

FIG. 1 shows one embodiment of a neutralizing apparatus of the present invention. Referring to FIG. 1, a rectangular housing 1 is constructed by jointing six panels 1a to 1f which are conductors (SUS or the like). A substantially square socket-shaped opening $1a_o$ is provided in an intermediate portion of the top panel 1a. A quadrangular pyramid-shaped housing projection portion 1A is provided on the opening 1a0 by jointing triangular panels 1Aa to 1Ad which are conductors (SUS or the like). The panels 1b to 1f are grounded, and an insulating material 1m is interposed between the top panel 1a and other panels 1b to 1f. As a result, the housing projecting portion 1A is insulated electrically from the panels 1b to 1f.

Figure 2:
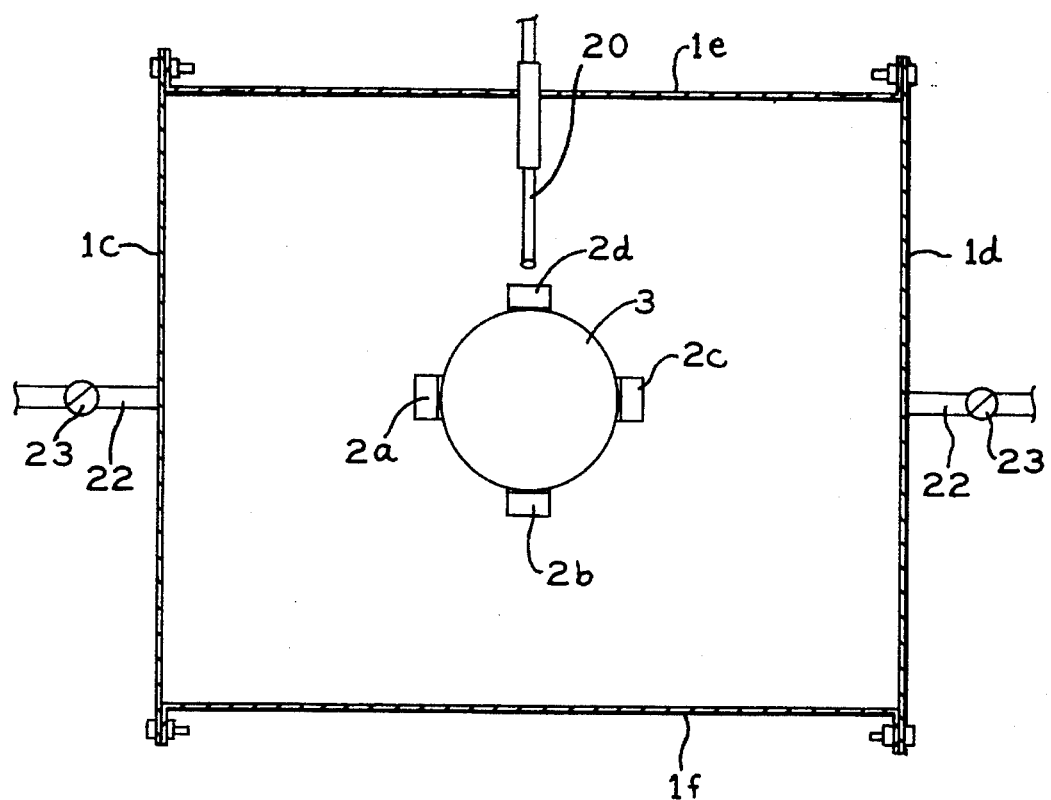
FIG. 2 is a sectional view taken along line II—II of FIG. 1.

Four supporting stands 2a to 2d are provided to stand vertically on an intermediate portion of the bottom panel 1b of the housing 1. A wafer 3 is mounted on a supporting portion which is provided at upper portions of the supporting stands 2a to 2d (see FIG. 2). Voltage supply means used for charging test may be connected to the wafer 3 supported by the supporting portions.

A gas introducing pipe 4 is connected to a top portion of the housing projection portion 1A, and the gas introducing pipe 4 is connected to an unillustrated gas supply source via a valve 4a. Gas supplied from the gas supply source via a valve 4B and a flow meter 4A is selected so as to introduce non-reactive gas to the wafer 3, i.e., nitrogen $N_2$ gas (or argon Ar gas or the like) which does not contaminate the wafer 3.

The housing projecting portion 1A is provided with a DC voltage source 15 (which is, for example, in a range of $-1000$ [V] to $+1000$ [V]) used to control ion generation as will be described. The DC voltage source 15 is connected in parallel with a high-resistance 16. On the other hand, the lateral panel 1b and 1d are provided with exhaust pipes 22 respectively having valves 23.

Figure 3:
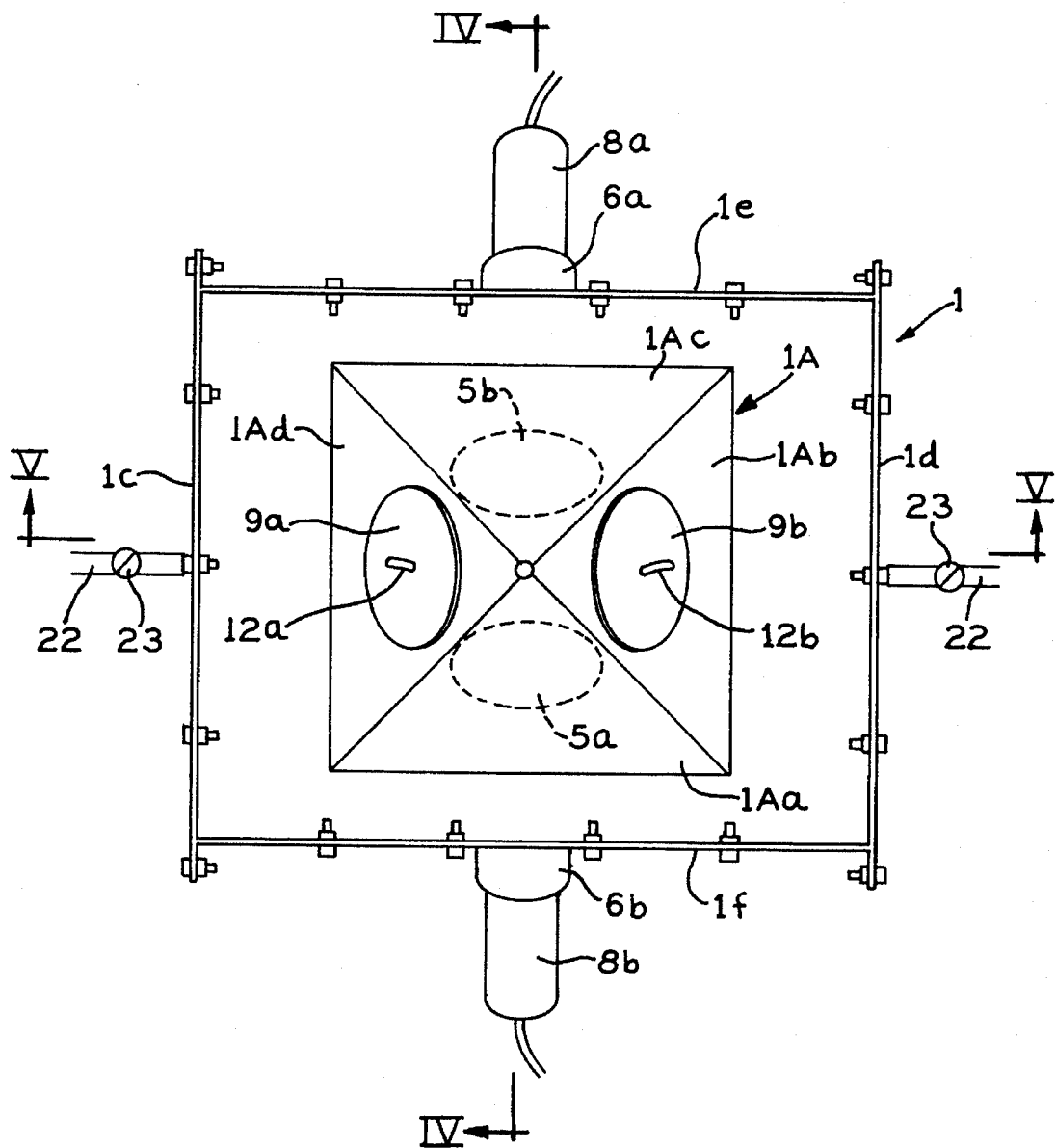
FIG. 3 is a top view of FIG. 1.

Further, disk-type photocathode members 5a and 5b are respectively provided on the side of inner surfaces of triangular panels 1Aa and 1Ac opposed to each other in the housing projecting portion 1A (see FIG. 3). On the other hand, the lateral panels 1f and 1e are provided with hoods 6a and 6b, respectively. Transmission windows 7a and 7b are transparent with respect to at least ultraviolet rays, and arc respectively fixed to the hoods 6a and 6b (see FIG. 4). Light sources (an ultraviolet lamp, a mercury lamp or the like) 8a and 8b are provided in the vicinity of the hoods 6a and 6b, and serve to project the ultraviolet rays toward the photocathode members 5a, 5b through the transmission windows 7a, 7b, respectively. A filter for thermal shield may be provided for the light sources 8a and 8b as desired.

The photocathode members 5a, 5b, the light sources 8a, 8b and the like are provided to form a first neutralizing charge generating means.

On the other hand, disk-type insulating members 9a and 9b are respectively provided for triangular panels 1Ab and 1Ad opposed to each other in the housing projecting portion 1A (see FIG. 3). The insulating member 9a and 9b are provided with needle-type electrodes 10a and 10b coated with quartz passing through intermediate portions there of toward the inside of the housing 1. Further, the insulating members 9a, 9b are provided with opposing electrodes 11a and 11b which are paired with the needle-type electrodes 10a and 10b, respectively. The needle-type electrodes 10a and 10b are respectively connected to an unillustrated high voltage source via electric wires 12a and 12b, while the opposing electrodes 11a and 11b are grounded via electric wires 13a and 13b, respectively. The construction of the opposing electrodes 11a, 11b is further shown in FIG. 6 in detail. The opposing electrodes 11a and 11b have a toroidal portion 11a0 with the needle-type electrode 10a (the electrode 10b serving similarly) as a center, and a supporting wire portion 11a1 connected to the electric wire 13a. As shown in FIG. 7, the insulating member 9b (the insulating member 9a serving similarly) is secured to a flange opening portion of the panel 1Ab by screws 14 through mounting holes 9b0 which are provided in an outer peripheral portion of the insulating member 9b.

The needle-type electrodes 10a, 10b and the opposing electrodes 11a, 11b or the like are provided as a discharging apparatus to form a second neutralizing charge generating means.

On the other hand, as shown in FIG. 4, a voltage probe 17 is provided under the wafer 3 supported on the supporting stands 2a to 2d. A surface potential meter 18 is connected to the probe 17, the surface potential meter 18 is connected to a lamp control unit 19, and the lamp control unit 19 is connected to the light source 8a (the light source 8b serving similarly). Further, an insulating pipe 20 is fitted into the lateral panel 1f, and one end of the insulating pipe 20 is inserted into the housing 1 and the other end thereof is connected to an ion analyzer 21. The surface potential meter 18 is connected to a discharge control unit which is connected to the needle-type electrodes 10a, 10b even though the surface potential meter 18 is not shown in the drawing. Outer surface of the housing projecting portion 1A is provided with radiating means such as water cooled radiating means or air cooled radiating means even though the radiating means are not shown in the drawing.

As the embodiment is constructed as set forth above, if the wafer 3 mounted in the housing 1 containing the gaseous nitrogen is positively charged due to the handling or the like by instruments made of fluorocarbon resin, the probe 17 detects the charged condition. Accordingly, the surface potential meter 18 displays a predetermined positive potential. When display value of the potential meter 18 exceeds a predetermined value, the lamp control unit 19 is operated to turn ON the light sources 8a and 8b, to irradiate ultraviolet rays to the photocathode member 5a and 5b, and to generate electrons in the housing projecting portion 1A. Consequently, the electrons are moved to the wafer 3 disposed at a lower position due to inflow of the gaseous nitrogen from an upper portion of the housing projecting portion 1A (having the maximum flow rate of 10 [m/sec], or an electric field toward the bottom of the housing 1 from the upper portion of the housing projecting portion 1A. In this case, it is possible to control the amount of generating electrons by adjusting the DC voltage source 15. The electrons reaching the surface of the wafer 3 are neutralized with positive charges of the wafer 3. If the surface potential meter 18 shows a value not more than the predetermined value (not more than several tens volts) due to the neutralization, the light sources 8a and 8b are turned OFF.

On the other hand, when the wafer 3 is negatively charged due to contact or the like with, for example, high speed flow of gaseous nitrogen, the surface potential meter 18 displays a negative value. If the display value exceeds the predetermined value, the discharge control unit is operated to supply voltage to the needle-type electrodes 10a and 10b so as to start the corona discharge. Thus, electrons and positive ions of the gaseous nitrogen are generated in the housing 1. In this case, the amount of the generated positive ions can be controlled by adjusting the DC voltage source 15. The generated positive ions reach the surface of the wafer 3 along the flow of the gaseous nitrogen, and are neutralized with negative charge charged on the wafer 3. When the surface potential meter 18 shows a value not more than the predetermined value due to the neutralization, the voltage fed to the needle-type electrodes 10a, 10b is stopped. It is possible to monitor concentration of ions in the housing 1 by using the ion analyzer 21.

Water ($H_2O$) which is especially detrimental to the wafer can be set to have concentration of 20 [ppb] or less having no effect on contamination of the wafer by introducing high purity gaseous nitrogen or argon gas into the housing 1.

As set forth above, the wafer is negatively charged, and is at a high potential by spraying the high speed flow of the gaseous nitrogen on the wafer. However, when the wafer contacts low speed flow of the gaseous nitrogen (for example, at a rate of less than 10 [m/see]), the wafer becomes merely at a low potential of several tens volts or less. Therefore, when the wafer has been positively charged due to the handling or the like before the wafer contacts such a low speed flow of the gaseous nitrogen, the positively charged wafer never becomes negatively charged.

In the description of the embodiment as set forth above, in case the wafer is positively or negatively charged, the neutralizing charge generating means is employed to neutralize the respective positive and negative charges. However, only a neutralizing charge generating means for generating negative ions (or electrons) may be employed provided that the handling is restricted so as to always charge the wafer positively.

Figure 11:
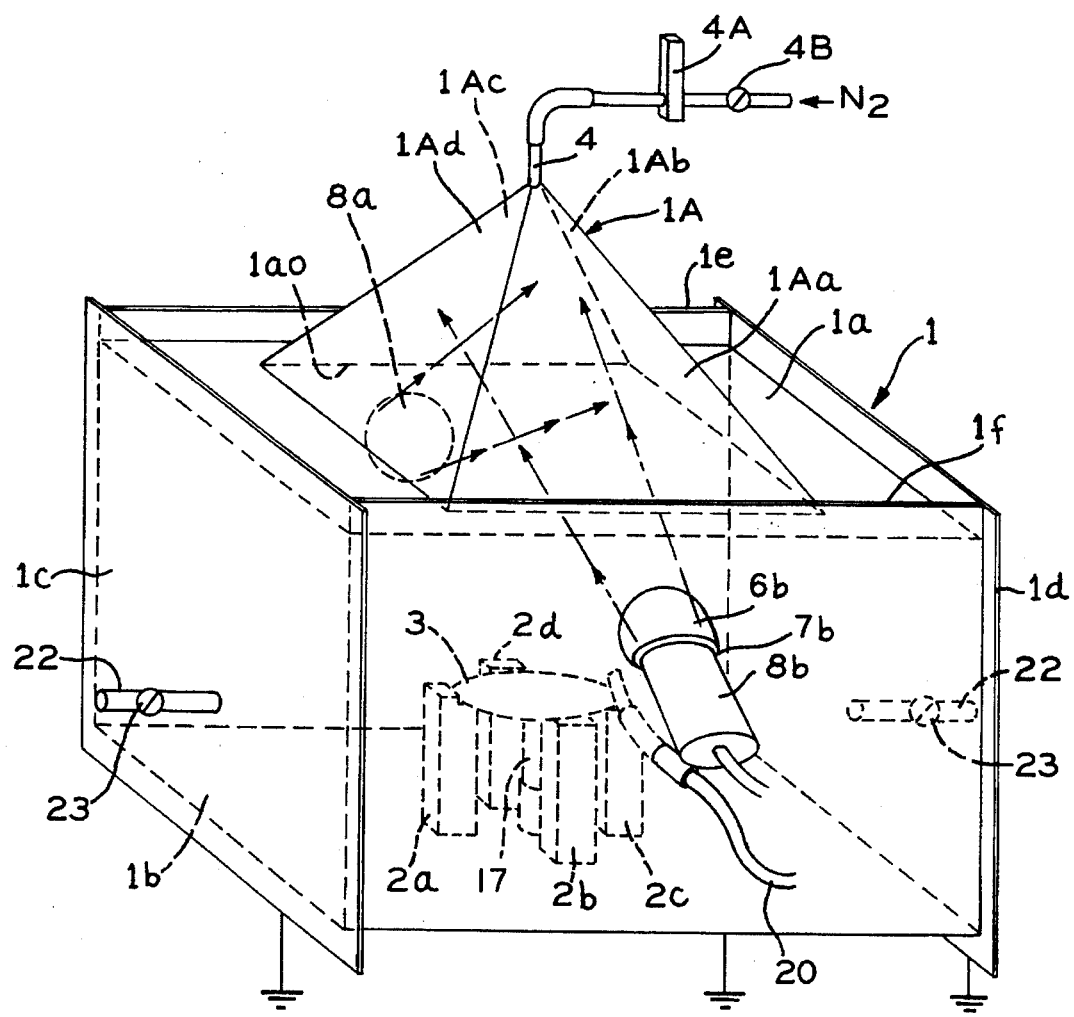
FIG. 11 is a perspective view showing another embodiment of the present invention, in which a neutralizing charge generating means includes only an irradiating light source of ultraviolet rays.

FIG. 11 shows another embodiment of the present invention, which is simply constructed based on the above embodiment. In other words, the photocathode members 5a, 5b forming the first neutralizing charge generating means in the above embodiment are omitted, and third neutralizing charge generating means simply including the light sources 8a and 8b is provided in FIG. 11. That is, light sources 8a and 8b are employed to enable irradiation of ultraviolet rays having the shortest wavelength of, for example, 145 [nm] in the embodiment. For example, if the gaseous nitrogen is introduced into the housing 1 where $H_2O$ has a concentration of 9.3 [ppm] at an ordinary temperature in the housing, gaseous nitrogen molecules introduced into the housing 1 and water ($H_2O$) molecules are excited and ionized by the irradiated ultraviolet rays. The light sources 8a, 8b are provided to use the ionization.

Figure 12:
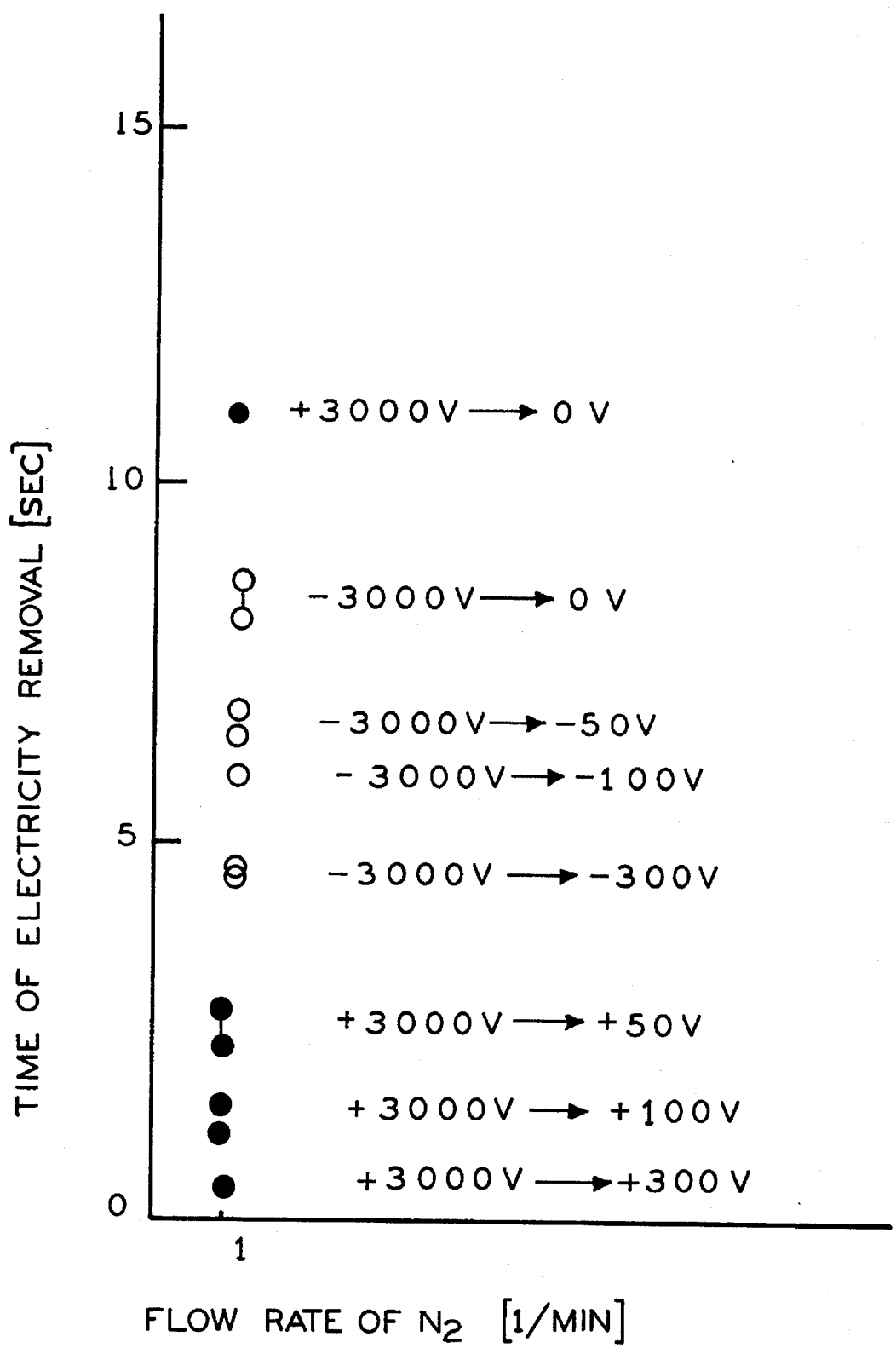
FIG. 12 is a view showing hourly variation of wafer potential at a predetermined flow rate of gaseous nitrogen.

FIG. 12 shows the result of experiment of the embodiment. Specifically, FIG. 12 shows a relationship between the flow rate of the gaseous nitrogen introduced into the housing 1 and time of electricity removal (sec) of the charge of the wafer 3 at the ordinary temperature In the housing 1, where the flow rate of the gaseous nitrogen is defined as a flow rate of 1 [l/min].

Referring to FIG. 12, in the embodiment constructed as set forth above, it will be appreciated that the residual potential of the wafer 3 can be always set to zero potential finally even if the wafer 3 is positively or negatively charged at a high potential (for example, at ±3000 [V]). The residual potential can be set to zero potential because gaseous molecules in the vicinity of the wafer are ionized to the same amount of positive and negative charges when the only ultraviolet rays are irradiated.

Referring to FIG. 12, it will be appreciated that the time of electricity removal varies depends upon whether initial charged polarity of the wafer is positive or negative. For example, when the wafer is charged at +3000 [V], reaching +300 [V] takes 0.3 to 0.4 [sec]. Nevertheless, reaching −300 [V] takes about five sec when the wafer is charged at −3000 [V]. This is because almost all of negative ions neutralizing positive charge includes electrons having large mobility, and positive ions neutralizing negative charge includes $N^{2+}$, $(H_2O)_nH^+$ (hydronium ion) or the like having small mobility so that the time required for reaching the wafer for the neutralization varies depending upon the ions.

IF the flow rate of the gaseous nitrogen introduced into the housing 1 is increased, mobility of the ions or electrons is also increased. Accordingly, it is supposed that the time of electricity removal is reduced.

Figure 13:
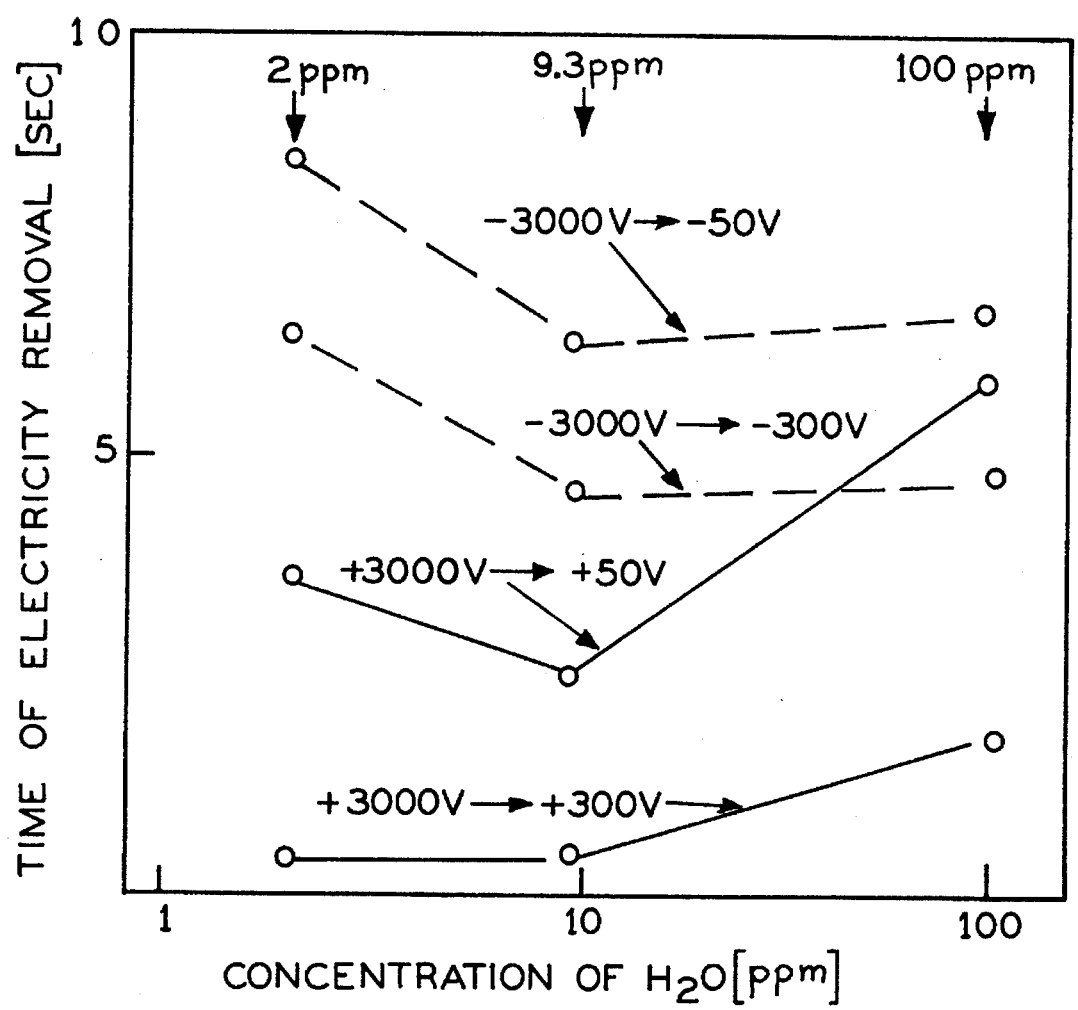
FIG. 13 is a graph showing variation of time of electricity removal with respect to concentration of $H_2O$.

FIG. 13 shows a relationship between the concentration of $H_2O$ in the housing 1 and the time of electricity removal. In this case, the experiment was performed with the concentration of $H_2O$ set in a range of 2 to 100 [ppm], the flow rate of the gaseous nitrogen set to 1 [l/min], and a room temperature in the housing 1 set to the ordinary temperature.

With reference to FIG. 13, the time of electricity removal tends to become the shortest time when the concentration of $H_2O$ is equal to 9.3 [ppm] if the wafer is positively charged. On the other hand, the longest time of electricity removal can be obtained when the concentration of $H_2O$ is equal to 2 [ppm] if the wafer is negatively charged. This implies that the time of electricity removal is not only simply related to ion concentration. $H_2O$ is easier ionized than nitrogen if making a comparison between $H_2O$ molecule and nitrogen molecule, and the total number of the generated ions with high concentration of $H_2O$ becomes larger than that of the generated ions with low concentration of $H_2O$. However, the time of electricity removal is not naturally reduced. That is, as the time of electricity removal is related to magnitude of the mobility as well as to the total number of ions, it should be considered that composition of ions can dominate the time of electricity removal.

On the other hand, as shown in FIG. 13, it will be understood that the longest time of electricity removal can be obtained when the $H_2O$ concentration is equal to 100 [ppm] if the wafer is positively charged. As will be appreciated, this is because other impurities other than moisture are discharged from inner walls of the housing 1, and the impurities contain much material which is easily negatively ionized. That is, this is because the time required for the ions reaching the wafer is longer since the total number of the negative ions is increased so that the mobility of the negative ion becomes dominant as the number of the negative ions increases even if the total sum of the negative ions is equal to that of the electrons, resulting in longer time required for the ion to reach the wafer.

Meanwhile, the time of electricity removal becomes short when the $H_2O$ concentration is low if the wafer is positively charged. As will be appreciated, this is because the mobility of the electrons becomes dominant.

Referring to FIG. 13, with respect to a time interval between a time when the wafer is positively charged (at +3000 [V]) and a time when the wafer has a wafer potential of +50 [V], the time interval with the $H_2O$ concentration of 2 [ppm] is slightly longer than that with the $H_2O$ concentration of 9.3 [ppm]. This is possibly because the total number of the generated ions is decreased if the $H_2O$ concentration becomes low. It is considered, more strictly supposed, that the total number of the generated ions becomes constant, and the time of electricity removal also becomes constant when the $H_2O$ concentration is decreased to a concentration lower than 2 [ppm].

As will be understood from FIG. 13, if the wafer is negatively charged, the longest time of electricity removal can be obtained when the $H_2O$ concentration is equal to 2 [ppm], while the shortest time of electricity removal is obtained when the concentration is equal to 9.3 [ppm]. However, there is little difference between both cases. This is possibly because the composition of ions is varied during variation of the $H_2O$ concentration. That is, this is because many clusters having a plurality of combined water molecules are generated since there are many hydronium ions when the $H_2O$ concentration is high.

The larger the mass of ions becomes, the greater the mobility of the ions becomes. Specifically, the mobility of ions becomes greater in the order of $(H_2O)H^+$ (mass is 19), $N_2^+$ (mass is 28), $(H_2O)_2H^+$ (mass is 37) to $(H_2O)_nH^+$. Consequently, the more a rate of content of $H^+$ ion is increased, the more the time of electricity removal is reduced, while the more the rate of content of $(H_2O)_nH^+$ is increased, the more the time of electricity removal is increased.

Figure 14:
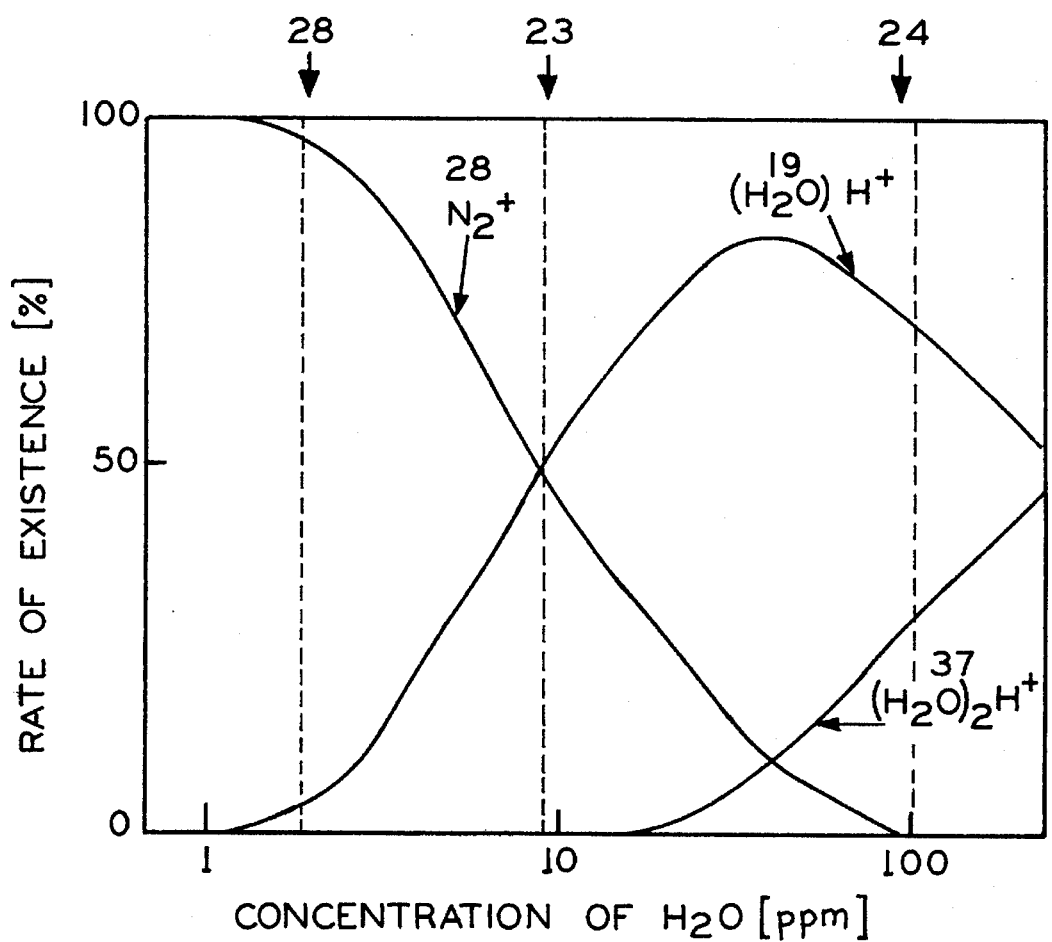
FIG. 14 is a graph virtually showing variation of ion composition with respect to the concentration of $H_2O$.

This will be further appreciated by understanding a relationship of composition of each ion with respect to the $H_2O$ concentration with reference to FIG. 14. That is, as shown in FIG. 14, $(H_2O)H^+$ accounts for 70 to 80% and $(H_2O)_2H^+$ accounts for the rest percentage when the $H_2O$ concentration is equal to 100 [ppm], and the resultant average mass becomes on the order of 24. $(H_2O)H^+$ and $N_2^+$ respectively account for the substantially same percentage when the $H_2O$ concentration is equal to 9.3 [ppm], and the resultant average mass becomes on the order of 23. $N_2^+$ accounts for almost all the percentage when the $H_2O$ concentration is equal to 2 [ppm], and the resultant mass becomes on the order of 28. In other words, it can be considered that there is a constant correlation between the average mass and the time of electricity removal.

Figure 15:
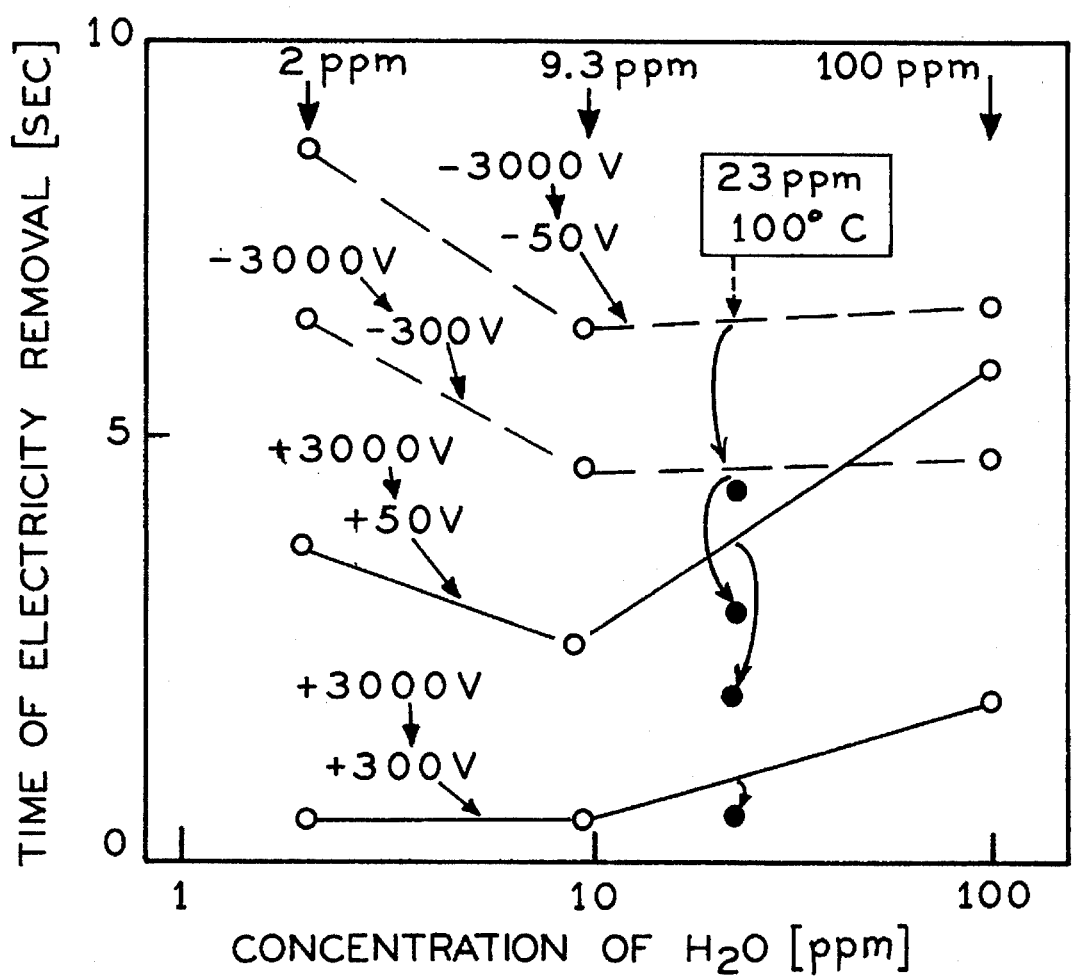
FIG. 15 is a graph showing variation of the time of electricity removal with respect to the concentration of $H_2O$ in a high temperature atmosphere of a housing.

FIG. 15 shows a comparison of electricity removal performance in two cases, i.e., one case where inside of the housing 1 is set at a high temperature atmosphere (which is, more specifically, baked at 100° C.), and the other case where the inside of the housing 1 is set at the ordinary temperature. Referring to FIG. 15, the time of electricity removal of the baking case is reduced to substantially half the time of electricity removal of the ordinary temperature case. This is possibly because of two reasons as follows: a first reason is that the atmosphere temperature rises so that a free path of molecule is extended, and therefore the mobility of ions (or electrons) is increased to reduce time required for the neutralization. A second reason is that the variation of the $H_2O$ concentration causes the variation of composition of ion as set forth above. Supposed depending upon only content shown in FIG. 14, the time of electricity removal should be the shortest since positive ion has the smallest mass when the $H_2O$ concentration is in a range of 20 to 40 [ppm]. However, since the first reason and the second reason are compounded to exert in actuality, it is considered that the electricity removal performance can be enhanced when the baking is performed.

Figure 16:
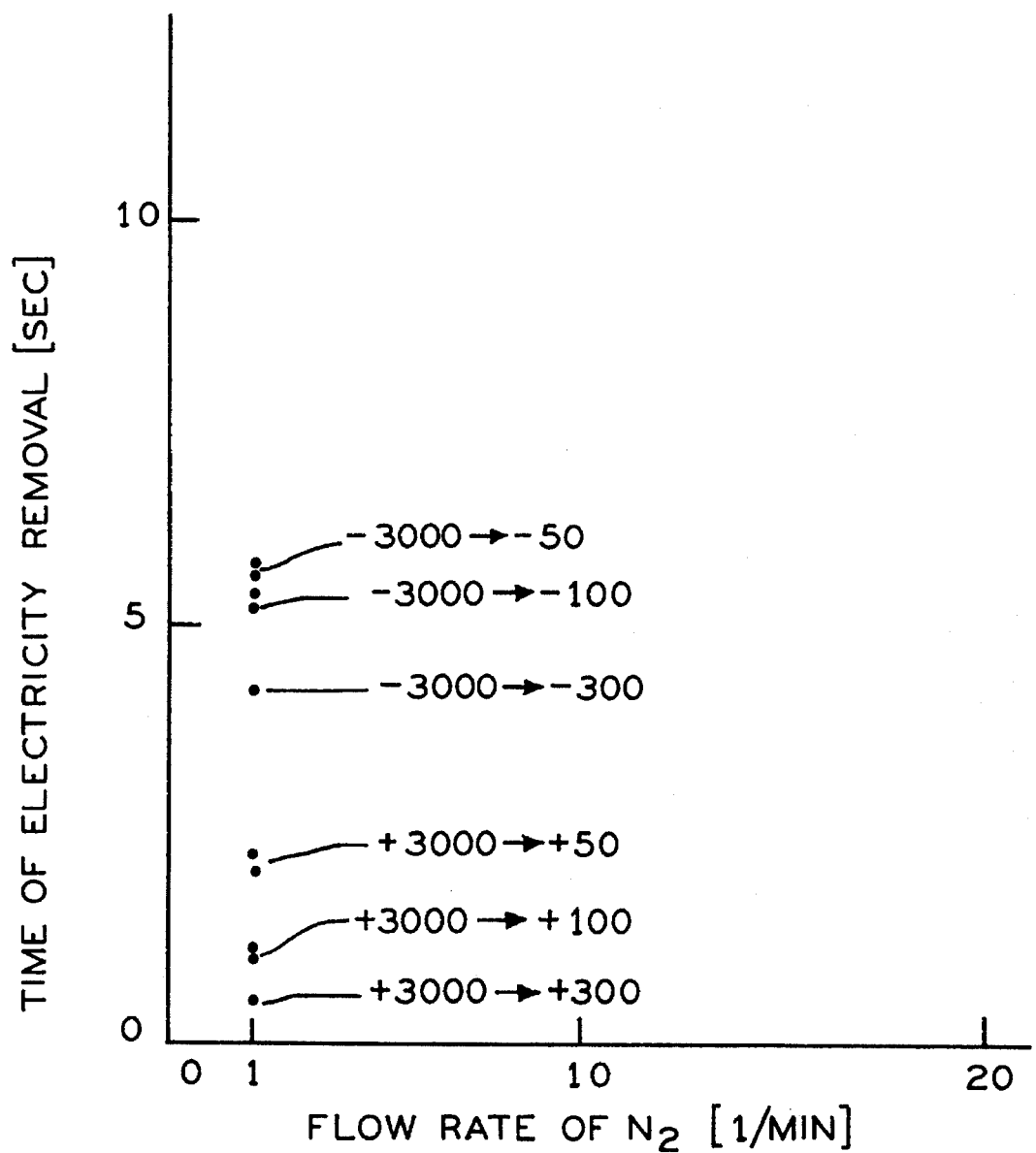
FIG. 16 is a view showing hourly variation of the wafer potential at the predetermined flow rate of gaseous nitrogen.

FIG. 16 shows the result in case ultraviolet rays is irradiated to the Al photocathode members as in the above embodiment provided that the $H_2O$ concentration is equal to 9 [ppm] and the ordinary temperature is maintained in the housing 1, and the gaseous nitrogen flows at a predetermined flow rate (of 1 [l/min]). Each plot described on the upper side of FIG. 16 shows a case where the wafer is positively charged, and each plot described on the lower side of FIG. 16 shows a ease where the wafer is negatively charged. The time of electricity removal of the former ease is longer than that of electricity removal of the latter case. If the flow rate of the gaseous nitrogen is increased, the time of electricity removal is reduced as described with reference to FIG. 12.

Figure 17:
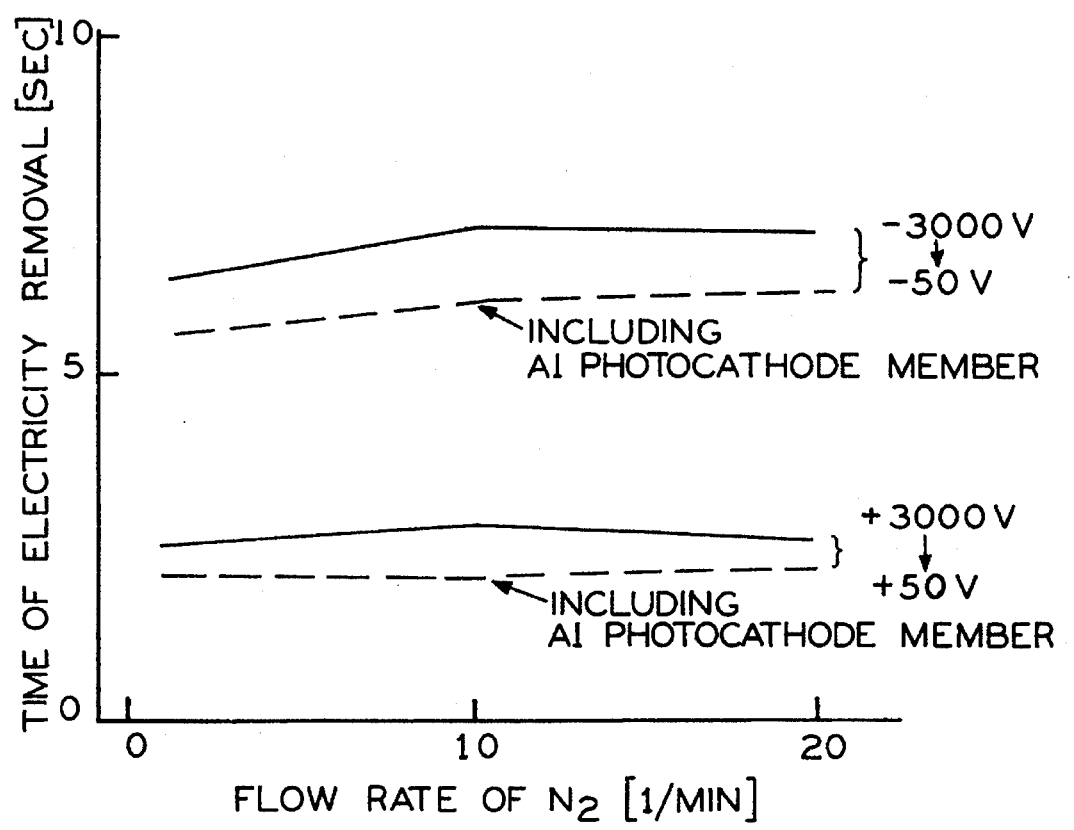
FIG. 17 is a graph showing a comparison between two cases, i.e., one case where neutralizing charge generating means including a photocathode member is employed with a predetermined concentration of $H_2O$, and the other case where neutralizing charge generating means constructed to exclude the photocathode member is employed.
Figure 18:
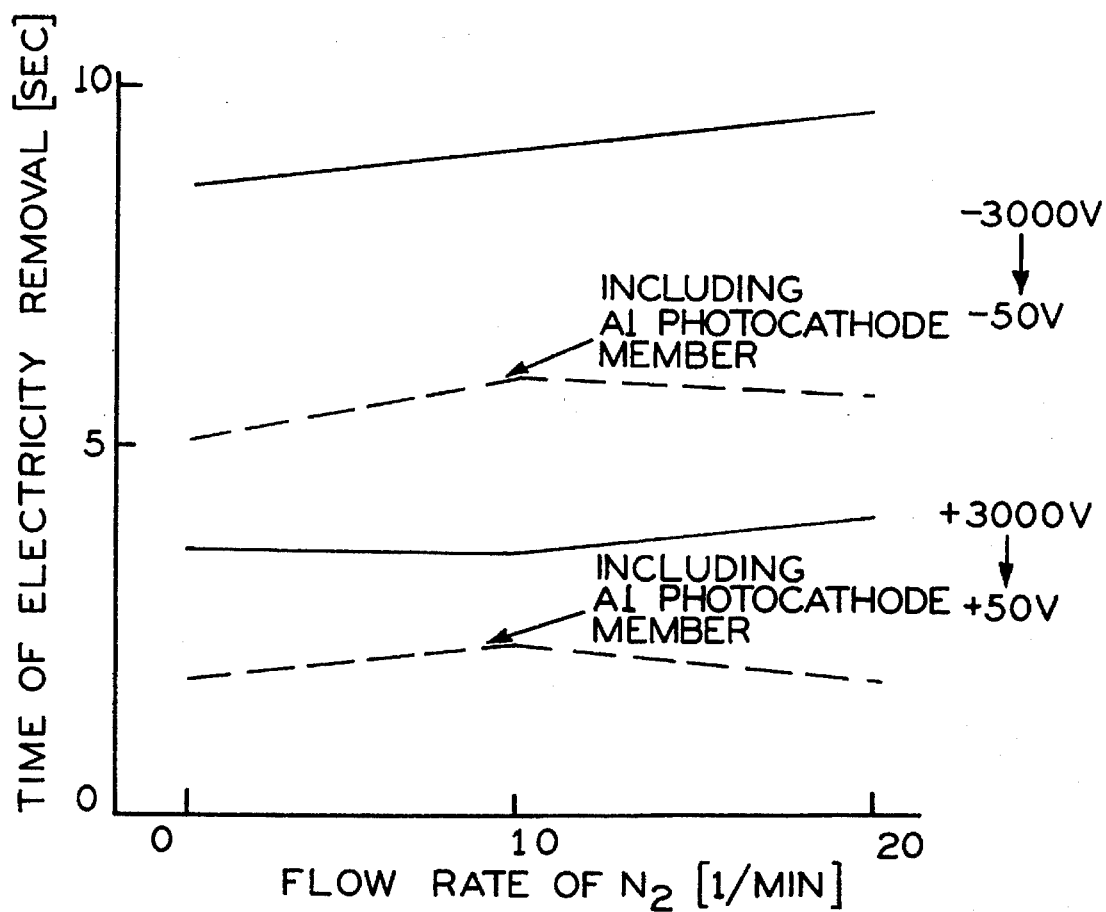
FIG. 18 is a graph showing the same comparison between two cases as in the case of FIG. 17 except another predetermined concentration of $H_2O$.

FIGS. 17 and 18 show variations of the time of electricity removal with respect to the flow rate of the gaseous nitrogen in the following two cases for the purpose of comparison: one case where the ultraviolet rays are irradiated to the photocathode member as in the above-mentioned embodiment, and the other case where the ultraviolet rays are directly irradiated into the housing as in the embodiment. Further, the $H_2O$ concentration In the housing 1 is equal to 9 [ppm] in FIG. 17, while the $H_2O$ concentration is equal to 2 [ppm] in FIG. 18. A photocathode member made of Al is employed as the photocathode members 5a (5b serving similarly).

Referring to FIGS. 17 and 18, it will be understood that the time of electricity removal becomes shorter in case the ultraviolet rays are irradiated to the photocathode member 5a in either case, that is, in case of the above-mentioned embodiment. Further, the time of electricity removal in case the wafer is negatively charged is longer than that of electricity removal in case the wafer is positively charged, but there is not so significant difference between both the times of electricity removal.

The description will be given of an example experiment which was performed to ensure whether or not the electron is discharged from the photocathode member 5a in the embodiment where the photocathode member 5a is provided. In the example experiment, variation of a potential of the housing 1 when the ultraviolet rays are irradiated was tested provided that the upper portion of the housing 1 having the photocathode member 5a is insulated electrically. If the electrons are discharged, the housing 1 should be positively charged. However, there was no variation in the potential of the housing 1. The same result was obtained in either of two cases, one case where the photocathode member is omitted, and the other case where the potential of the wafer is variously varied. As to the result, it is necessary to perform further precise test under other laboratory conditions such as variation of wavelength of the irradiated ultraviolet rays by using an optical filter, or measurement of ion current of the wafer.

Further, with reference to FIGS. 17 and 18, there is no constant correlation between the flow rate of the gaseous nitrogen and the time of electricity removal. This only means that there is left much room for improvement with respect to setting of the laboratory conditions, but never means that there is no correlation. In addition, there is eventually held a correlation where the time of electricity removal is reduced if the flow rate is increased as set forth above.

Moreover, the times of electricity removal were compared with each other in two cases, one case of the conventional method in which an ionizer is provided, and the other case of the embodiment where the photocathode member is omitted. In this case, it was demonstrated that the time of electricity removal of the embodiment could be reduced to about one tenth of that of electricity removal of the conventional method. In addition, there is an excellent effect in that the residual potential on the wafer can be always set to zero.

Figure 8:
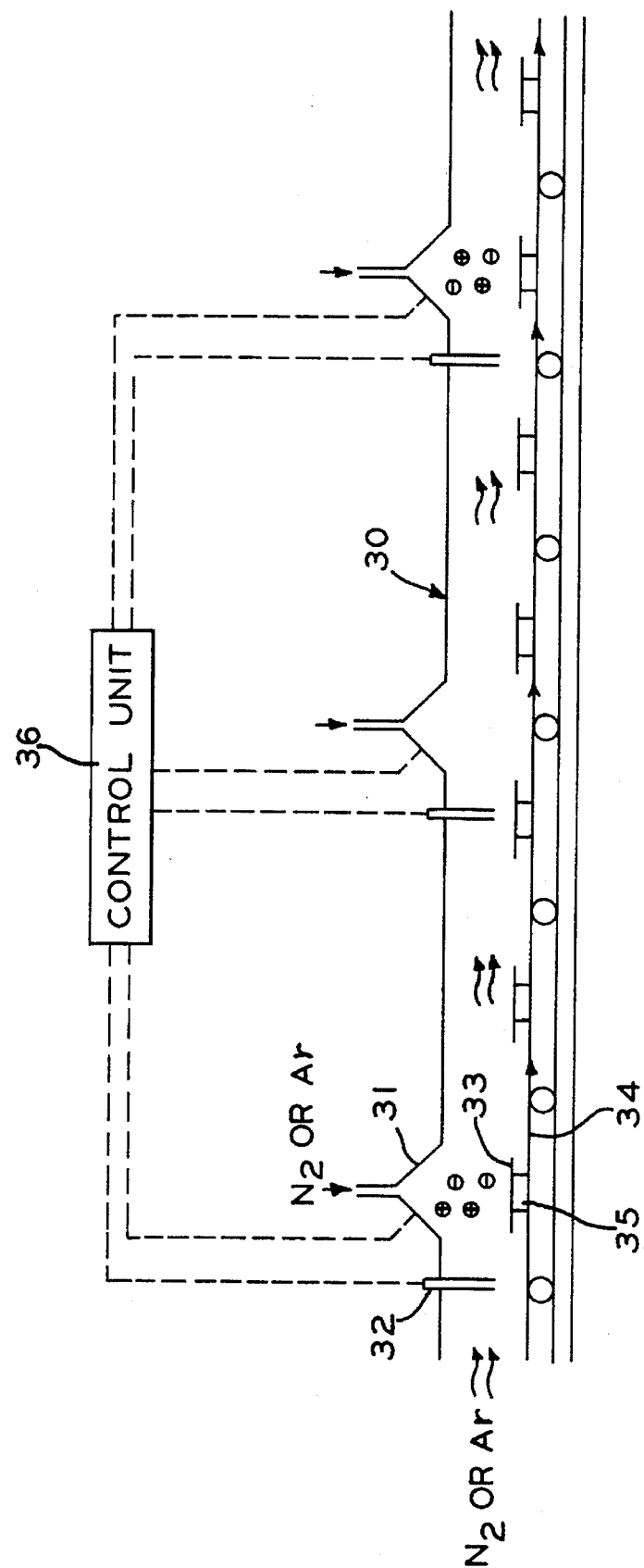
FIG. 8 is a schematic block diagram showing another embodiment of the present invention.
Figure 9:
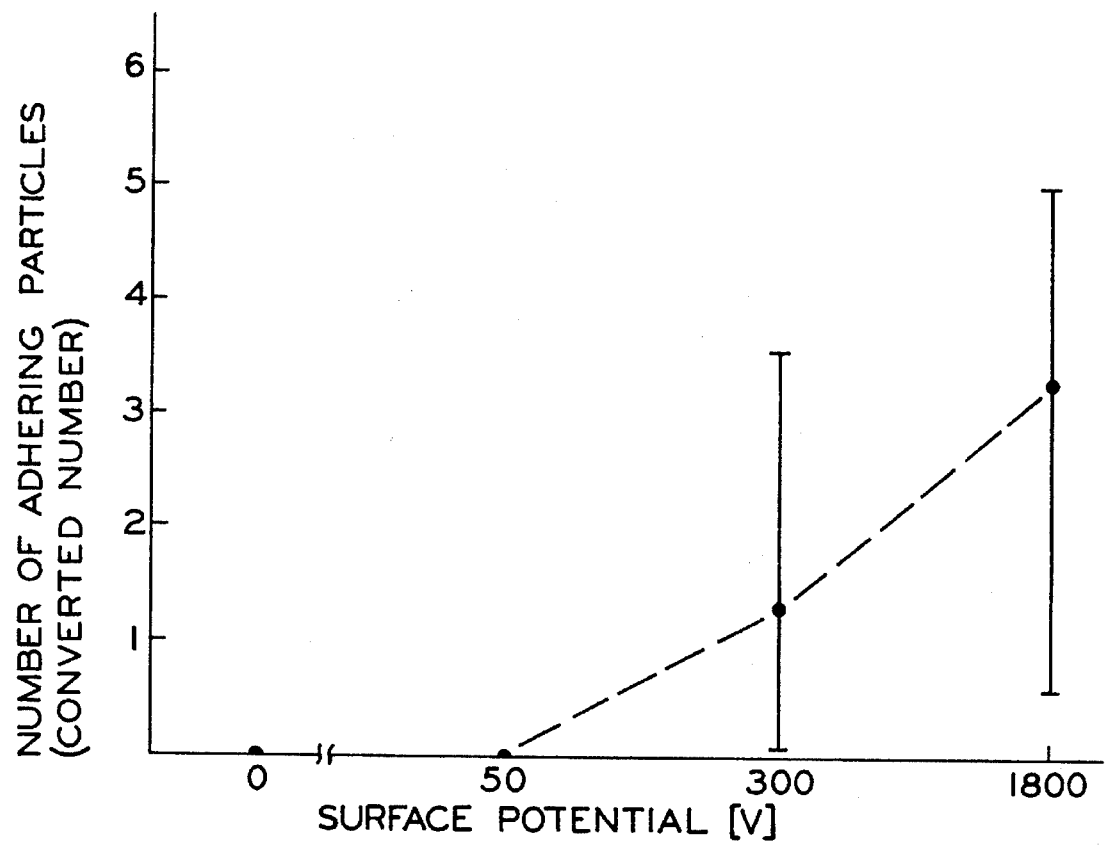
FIG. 9 is a graph showing a relationship between a surface potential of a wafer and the number of adhering particles.
Figure 10:
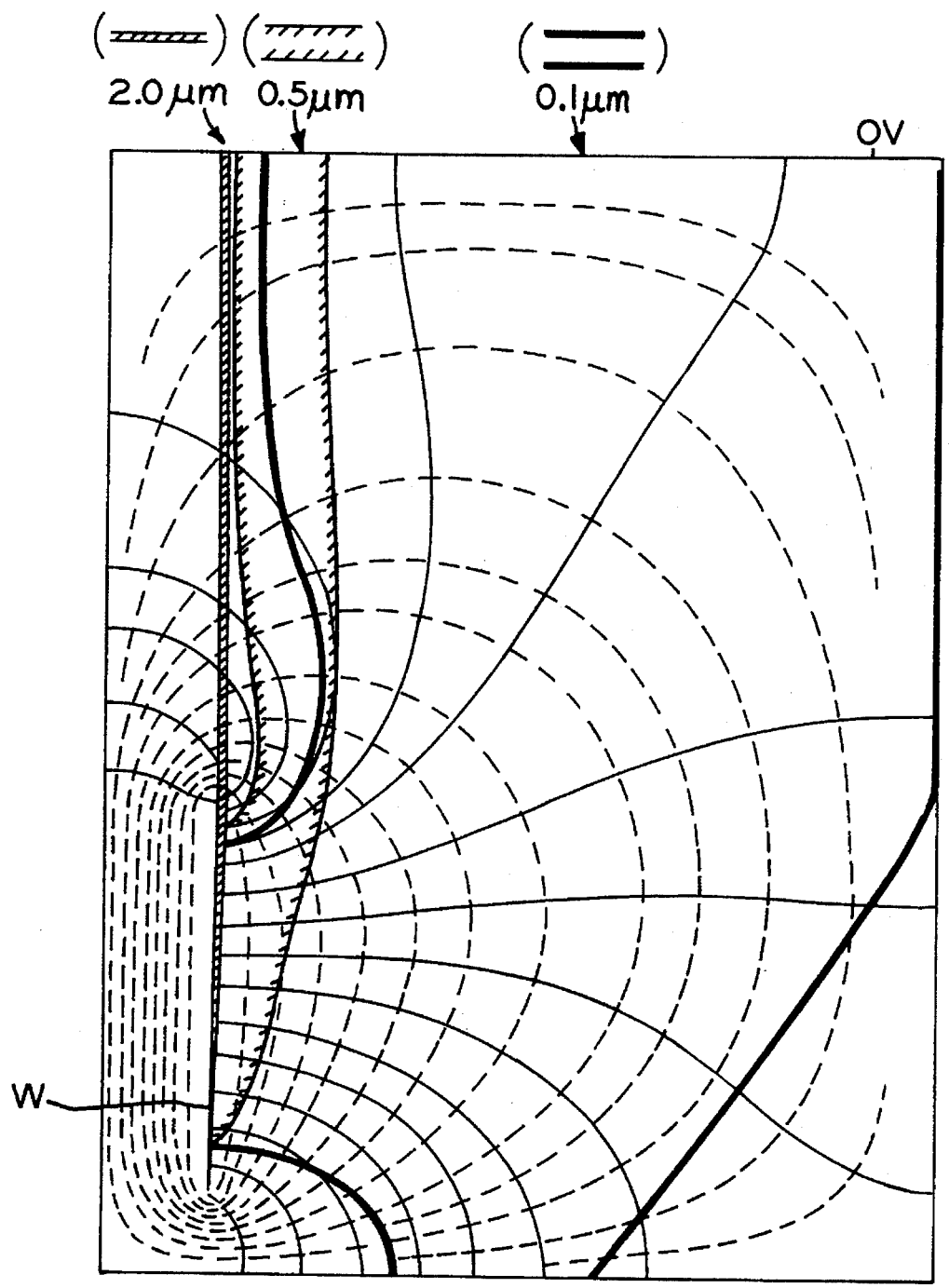
FIG. 10 is a typical diagram showing an adhering range of suspended particles on a charged wafer.

FIG. 8 shows another embodiment of the present invention. With reference to FIG. 8, in order to ensure a constant carrying atmosphere in a tunnel housing 30, gaseous nitrogen (or argon gas or the like) flows always in the carrying direction (in the direction of the right in FIG. 8) at a predetermined flow rate. A carrying conveyor 34 is provided in the tunnel housing 30, and wafers 33 are respectively mounted on many supporting stands 35 provided on the carrying conveyor 34. On the other hand, tunnel housing projecting portions 31 are provided at upper portions of the tunnel housing 30 at predetermined intervals. Further, the gaseous nitrogen is introduced from upper portions of the tunnel housing projecting portions 31. Surface potential meters 32 are respectively provided in the vicinity of the respective tunnel housing projecting portions 31, and are connected to a control unit 36. The control unit 36 is connected to a neutralizing charge generating means (not shown) provided For the respective tunnel housing projecting portions 31. The neutralizing charge generating means is constructed to generate positive ion or negative ion selectively, and is constructed as in the first and the second neutralizing charge generating means in the above embodiment.

A neutralizing apparatus of the embodiment is constructed as set forth above. It is assumed that the wafer 33 passing through the tunnel housing 30 is negatively charged by contacting, for example, the flow of the gaseous nitrogen, and display value of the surface potential meter 32 exceeds a predetermined value. At the time, the control unit 36 is operated to cause the neutralizing charge generating means to generate the positive ion selectively. As a result, the charge of the wafer can be neutralized.

The amount of the gaseous nitrogen introduced into the tunnel housing 30 from the upper portion of the respective tunnel housing projecting portions 31 is less than the amount of the gaseous nitrogen flowing in the carrying direction of the wafer 33. Therefore, the gaseous nitrogen introduced into the tunnel housing 30 does not exert influence on the flow rate of the gaseous nitrogen for the carrying atmosphere.

In the embodiment, the neutralizing charge generating means for generating only the negative ions (or electrons) may be provided when the wafer is restricted only to be positively charged as in the case of the above-mentioned embodiment.

Availability in Industry

As described hereinbefore, a neutralizing apparatus of the present invention is provided with a housing which can contain a charged body having a predetermined charge, gas introducing means for introducing non-reactive gas into the housing with respect to at least the charged body, and neutralizing charge generating means for selectively generating ions which can neutralize the predetermined charge in the housing. Therefore, it is possible to avoid a charged condition of an easily charged body in the housing, and to perform the neutralization with respect to the easily charged body in the non-reactive gaseous atmosphere. As a result, it is possible to prevent an undesirable state such as a formation of natural oxide film, or an occurrence of dark current or leakage current in advance.

The neutralizing charge generating means is provided with a light source for projecting ultraviolet rays into the housing, and the ultraviolet rays can excite at least the atmosphere in the housing. There are several excellent effects in that a time required for electricity removal can be reduced to at least one tenth of the time required for an electricity removal method using an ionizer, and residual potential of the charged body (wafer) can be always set to zero.

It is possible to implement a completely dustless processing, a processing without electromagnetic noise and a non-ozone (at a nitrogen atmosphere) and the like compared with at least the construction employing the conventional ionizer. Further, an excellent electricity removal performance (in evaluating the time of electricity removal, the residual potential and the like) can be obtained, an electricity removal system can be facilitated. As a result, wide utilization in a variety of fields will be expected.

The neutralizing charge generating means is a neutralizing charge generating means including the light source for projecting ultraviolet rays into the housing, and a photocathode member provided in the housing to receive the ultraviolet rays so as to generate external photoelectric effect. Consequently, if the charged body is always charged only positively, a centralized select of ion generation can be used for the neutralization. As a result, it is possible to simplify the entire construction of the apparatus.

In the neutralizing apparatus for the charged body the neutralizing charge generating means is provided with a first neutralizing charge generating means including the light source for projecting the ultraviolet rays into the housing and the photocathode member provided in the housing to receive the ultraviolet rays so as to generate the external photoelectric effect, and a second neutralizing charge generating means including a discharging apparatus for generating corona discharge in the housing. Further, the first and the second neutralizing charge generating means can be selectively operated. Therefore, it is possible to facilitate a construction of the neutralizing charge generating means In a simple method.

The non-reactive gas of the present invention is high purity nitrogen so that it is available at low cost.

The non-reactive gas of the present invention is high purity argon so that it can effectively exert effect on any type of charged bodies as inert gas.

I claim:

1. A neutralizing apparatus for a charged body, said neutralizing apparatus comprising:
   a housing for containing an electrically charged body;
   a gas introducing means for introducing gas into said housing, said gas being non-reactive with respect to a said charged body;
   a probe for detecting the amplitude of a charge on a said charged body;
   a first neutralizing charge generating means for generating negatively charged ions or electrons in said housings;
   a second neutralizing charge generating means for generating positively charged ions in said housing; and
   a control means for controlling said first and second neutralizing charge generating means, said control means connected to said probe, whereby said first neutralizing charge generating means is activated when said body is positively charged and the said positive charge on said body exceeds a predetermined voltage, and said second neutralizing charge generating means is activated when said body is negatively charged and said negative charge on said body exceeds a predetermined voltage.

2. A neutralizing apparatus according to claim 1, wherein said neutralizing charge generating means comprises a light source for projecting ultraviolet rays into said housing, and said ultraviolet rays can excite at least an atmosphere in said housing.

3. A neutralizing apparatus for a charged body according to claim 2, wherein said non-reactive gas is high purity argon.

4. A neutralizing apparatus for a charged body according to claim 2, wherein said non-reactive gas is high purity nitrogen.

5. A neutralizing apparatus according to claim 1, wherein said first neutralizing charge generating means comprises a light source for projecting ultraviolet rays into said housing, and a photocathode member located in said housing for receiving said ultraviolet rays and for generating an external photoelectric effect whereby ions and electrons are generated.

6. A neutralizing apparatus for a charged body according to claim 5, wherein said non-reactive gas is high purity nitrogen.

7. A neutralizing apparatus for a charged body according to claim 5, wherein said non-reactive gas is high purity argon.

8. A neutralizing apparatus for a charged body according to claim 1, wherein said non-reactive gas is high purity nitrogen.

9. A neutralizing apparatus for a charged body according to claim 1, wherein said non-reactive gas is high purity argon.

10. A neutralizing apparatus according to claim 1, wherein said first neutralizing charge generating means comprises a light source for projecting ultraviolet rays into said housing and a photocathode member located in said housing for receiving said ultraviolet rays and for generating an external photoelectric effect, and wherein said second neutralizing charge generating means comprises a discharge apparatus for generating a corona discharge in said housing.

11. A neutralizing apparatus for a charged body according to claim 10, wherein said non-reactive gas is high purity nitrogen.

12. A neutralizing apparatus for a charged body according to claim 10, wherein said non-reactive gas is high purity argon.

* * * * *